(12) United States Patent
Lauffer

(10) Patent No.: US 11,669,072 B2
(45) Date of Patent: Jun. 6, 2023

(54) DEVICE AND METHOD FOR OBTAINING INFORMATION ABOUT LAYERS DEPOSITED IN A CVD METHOD

(71) Applicant: AIXTRON SE, Herzogenrath (DE)

(72) Inventor: Peter Sebald Lauffer, Aachen (DE)

(73) Assignee: AIXTRON SE, Herzogenrath (DE)

( * ) Notice: Subject to any disclaimer, the term of this patent is extended or adjusted under 35 U.S.C. 154(b) by 153 days.

(21) Appl. No.: 16/955,667

(22) PCT Filed: Dec. 13, 2018

(86) PCT No.: PCT/EP2018/084732
§ 371 (c)(1),
(2) Date: Jun. 18, 2020

(87) PCT Pub. No.: WO2019/121313
PCT Pub. Date: Jun. 27, 2019

(65) Prior Publication Data
US 2021/0072731 A1    Mar. 11, 2021

(30) Foreign Application Priority Data

Dec. 19, 2017   (DE) .................... 10 2017 130 551.3

(51) Int. Cl.
*C23C 16/30*   (2006.01)
*C23C 16/448*  (2006.01)
(Continued)

(52) U.S. Cl.
CPC ........ *G05B 19/4155* (2013.01); *C23C 16/303* (2013.01); *C23C 16/4482* (2013.01);
(Continued)

(58) Field of Classification Search
CPC ................. C23C 16/52; C23C 16/303; C23C 16/45544–45551; C23C 18/1619–1632;
(Continued)

(56) References Cited

U.S. PATENT DOCUMENTS 6,153,261 A  * 11/2000 Xia .................... H01L 21/02222
                                                    427/255.393
6,732,004 B2 *  5/2004 Mos ...................... G03F 9/7092
                                                    700/121
(Continued)

FOREIGN PATENT DOCUMENTS

DE         10151259 A1    4/2003

OTHER PUBLICATIONS

International Preliminary Report on Patentability dated Jun. 23, 2020, from The International Bureau of WIPO, for International Patent Application No. PCT/EP2018/084732 (dated Dec. 13, 2018), 15 pages.

(Continued)

*Primary Examiner* — Victor A Mandala
*Assistant Examiner* — Lawrence C Tynes, Jr.
(74) *Attorney, Agent, or Firm* — Ascenda Law Group, PC

(57) ABSTRACT

Information about a process for depositing at least one layer on a substrate in a process chamber is obtained via a method including the step of storing actuation data and sensor values as raw data in a log file, together with their time reference. Knowledge about the quality of the deposited layer is obtained by using the raw data. For this purpose, process parameters are obtained from the raw data by means of a computing apparatus. The beginning and the end of the process steps for processing the substrate and their respective types are identified by analyzing the time curve of the process parameters. For at least some of the process steps, characteristic process step quantities corresponding to the particular type of the process steps are calculated from the measured values, and the obtained process step quantities are compared with comparison quantities associated with one or more similar process steps.

9 Claims, 3 Drawing Sheets

(51) Int. Cl.
  *C23C 16/52* (2006.01)
  *H01L 21/67* (2006.01)
  *G05B 19/4155* (2006.01)
  *H01L 21/02* (2006.01)
  *H01L 21/66* (2006.01)
  *C23C 16/54* (2006.01)

(52) U.S. Cl.
  CPC .............. *C23C 16/52* (2013.01); *C23C 16/54* (2013.01); *H01L 21/0242* (2013.01); *H01L 21/0262* (2013.01); *H01L 21/02381* (2013.01); *H01L 21/02387* (2013.01); *H01L 21/02538* (2013.01); *H01L 21/67253* (2013.01); *H01L 22/20* (2013.01); *G05B 2219/45031* (2013.01)

(58) Field of Classification Search
  CPC ......... C23C 14/3407–3428; C23C 14/56–568; C23C 16/54–545; C23C 16/5096; H01L 21/67253; H01L 21/0242; H01L 22/20; G05B 19/042; G05B 19/4155; G05B 2219/45031; G01D 7/00–12; G01D 9/00–9/42; G01D 15/00–347; G01R 13/00–42; C01P 2006/32–37; H02S 50/00–15; G09G 3/006; G09G 2330/12; G01N 2021/9513; B67D 7/342; B81C 1/00373; C25D 17/001; C25D 17/16–28; C25D 11/005; C25D 13/22–24; C30B 35/00–007; C30B 31/00–22; B33Y 30/00
  See application file for complete search history.

(56) References Cited

U.S. PATENT DOCUMENTS

| | | | | |
|---|---|---|---|---|
| 6,824,813 | B1 * | 11/2004 | Lill ................... | H01J 37/32935 216/60 |
| 2002/0048019 | A1 * | 4/2002 | Sui .................... | H01J 37/32935 257/E21.252 |
| 2004/0063328 | A1 * | 4/2004 | Wen .................. | H01L 21/32137 438/706 |
| 2004/0206621 | A1 * | 10/2004 | Li ..................... | H01L 21/67276 204/229.8 |
| 2005/0268853 | A1 * | 12/2005 | Yamamoto .............. | C23C 16/30 118/726 |
| 2007/0039924 | A1 * | 2/2007 | Dip ................... | H01L 21/02046 438/715 |
| 2007/0093071 | A1 * | 4/2007 | Verhaverbeke ... | H01L 21/67173 430/269 |
| 2007/0121124 | A1 * | 5/2007 | Nabatova-Gabain ....................... | G01B 11/0641 356/630 |
| 2008/0216077 | A1 * | 9/2008 | Emani .............. | G05B 19/41865 718/102 |
| 2008/0275586 | A1 * | 11/2008 | Ko ..................... | G05B 23/0221 700/109 |
| 2009/0276077 | A1 | 11/2009 | Good et al. | |
| 2011/0073039 | A1 * | 3/2011 | Colvin ................... | C23C 16/46 219/490 |
| 2014/0118751 | A1 * | 5/2014 | Rajagopalan ......... | C23C 16/505 356/630 |
| 2014/0137799 | A1 | 5/2014 | Jo et al. | |
| 2015/0039117 | A1 | 2/2015 | Park et al. | |
| 2016/0109498 | A1 * | 4/2016 | Jafarian-Tehrani .......................... | H01J 37/32926 118/712 |
| 2018/0010243 | A1 * | 1/2018 | Lee ......... | H01L 22/26 |
| 2018/0082826 | A1 * | 3/2018 | Guha ................. | H01L 21/3065 |
| 2018/0370835 | A1 * | 12/2018 | Otter ........................ | C03C 3/06 |

OTHER PUBLICATIONS

Written Opinion dated Apr. 25, 2019, from the ISA/European Patent Office, for International Patent Application No. PCT/EP2018/084732 (dated Dec. 13, 2018), English translation, 7 pgs.

International Search Report dated Apr. 25, 2019, from the ISA/European Patent Office, for International Patent Application No. PCT/EP2018/084732 (dated Dec. 13, 2018), 5 pages.

Written Opinion dated Apr. 25, 2019, from the ISA/European Patent Office, for International Patent Application No. PCT/EP2018/084732 (dated Dec. 13, 2018), 6 pages.

* cited by examiner

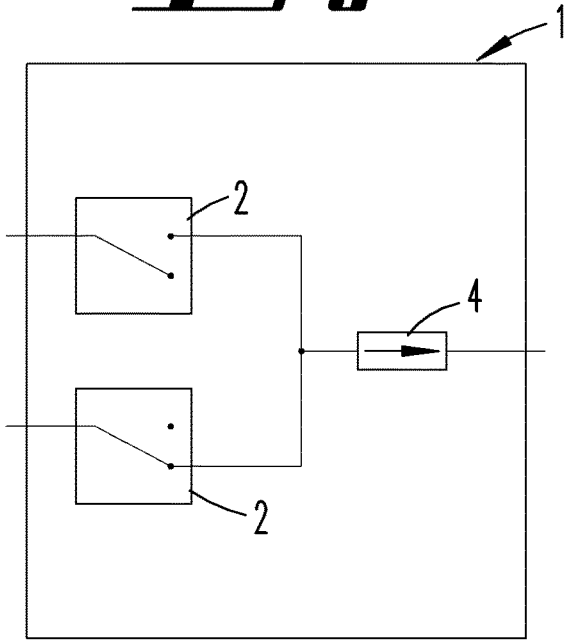
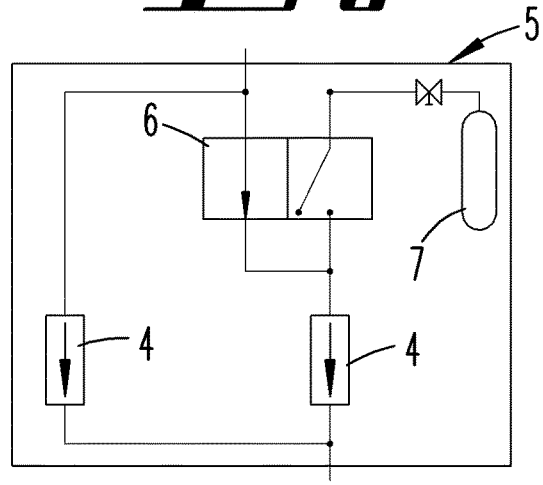
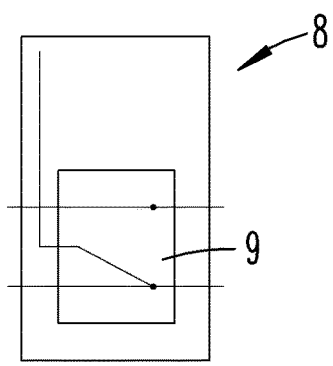
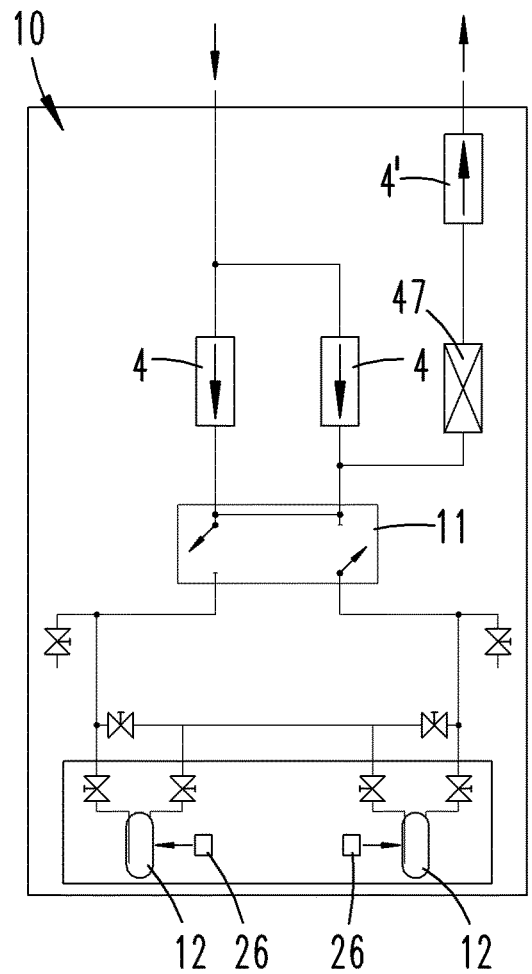

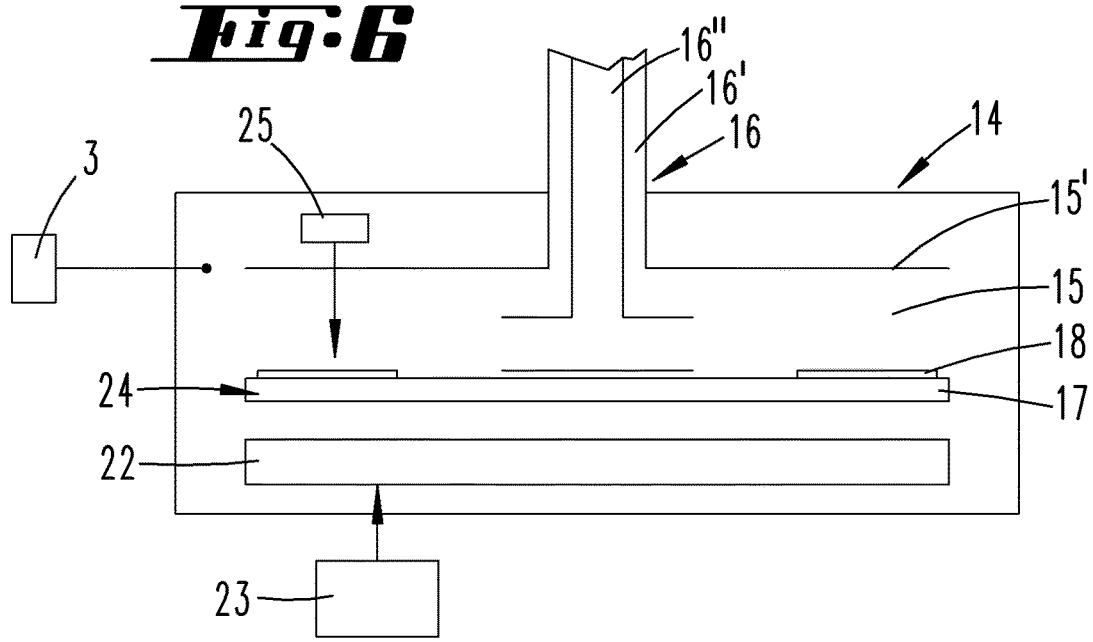
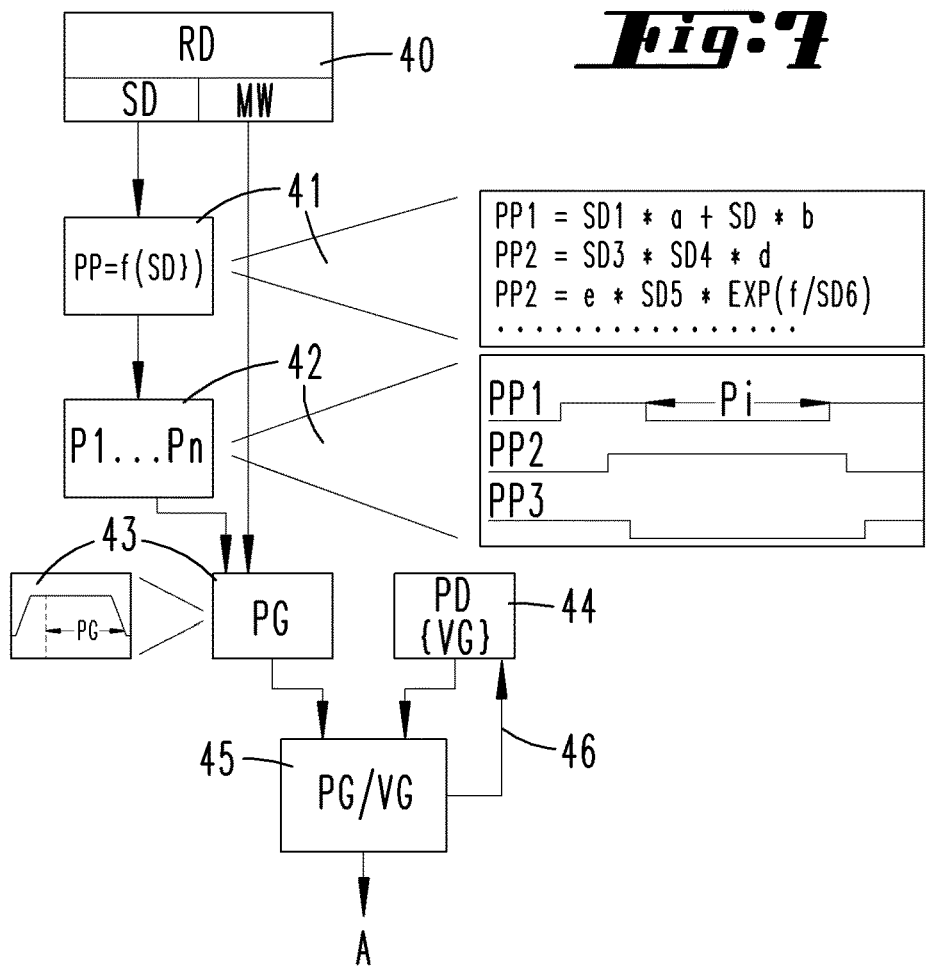

DEVICE AND METHOD FOR OBTAINING INFORMATION ABOUT LAYERS DEPOSITED IN A CVD METHOD

RELATED APPLICATIONS

This application is a National Stage under 35 USC 371 of and claims priority to International Application No. PCT/EP2018/084732, filed 13 Dec. 2018, which claims the priority benefit of DE Application No. 10 2017 130 551.3, filed 19 Dec. 2017.

FIELD OF THE INVENTION

The invention relates to a method for obtaining information regarding a process consisting of a plurality of steps which are carried out in succession in order to deposit at least one layer on a substrate, in particular a semiconductor layer, in a process chamber of a reactor, wherein raw data is used which contains at least the temporal sequence of actuation data for actuators.

Furthermore, the invention relates to a device which is configured in a manner such that the method in accordance with the invention is carried out with an electronic control device, in particular a control computer.

BACKGROUND

In mechanical engineering, equipping machines with sensors at sites which are relevant to the process or to the engineering is known; with the sensors, measured values, for example measured values for temperature or measured values for vibration, are determined. These measured values are stored and are evaluated by a computer. To this end, the measured values are mathematically correlated. This is carried out by inserting the measured values into mathematical formulae which digitally represent the function and the constructional design of the machine. This type of monitoring of the function of a machine is known in the literature as a "digital twin", which is stored in a computer.

US 2015/0039117 A1 discloses a semiconductor fabrication device in which measured values are collected with a plurality of sensors. The measured values are processed in an electronic processing unit, in which segments are formed from the plurality of measured values.

US 2008/0275586 A1 describes a method for the manufacture of coated wafers, in which the data is evaluated in a manner such that predictions regarding the result of a coating process can be made.

US 2009/0276077 A1 describes a method for obtaining information regarding a CVD process, wherein measurement data are processed with the aid of a digital model.

SUMMARY OF THE INVENTION

The invention concerns a method for determining information regarding a process consisting of a plurality of steps which are carried out in succession in order to deposit a semiconductor layer in particular, wherein the semiconductor layer is in particular a layer of a sequence of layers. Moreover, the invention concerns a device for carrying out the method. The device has a process chamber which is disposed inside a reactor housing which is protected against the surroundings in a gas-tight manner. Inside the reactor housing is a susceptor which can be heated to a process temperature by means of a heating means. At least one substrate is heated to a process temperature with the susceptor. One or more substrates may be positioned on a wide side face of the susceptor facing the process chamber. Opposite to this wide side face of the susceptor is a roof of the process chamber. The process chamber roof may be heated or cooled. Sensors are provided for determining a plurality of measured values, in particular for measuring the temperature of the process chamber roof and for determining the temperature of the surface of the susceptor as well as a pressure inside the process chamber. Furthermore, optical measuring instruments, for example IR or UV pyrometers, may be present in order to determine surface properties of the substrate or properties of the layers deposited on the surface of the substrate. The temperatures of the substrate surface or the actual layer thickness and therefore a growth rate can be determined from the measured values from the optical sensors. Furthermore, sensors are provided for determining pressure values or mass flow values in a gas mixing system. Other sensors determine the temperatures of annealing baths or cooling water circuits. A gas inlet means is provided through which the one or more process gases can be supplied to the process chamber. A gas mixing system has a plurality of actuators and sensors. Gas flows can be set with the actuators, wherein by means of valves, the process gases can be mixed together in the gas mixing system and can be switched backwards and forwards between a run line which discharges into the gas inlet means and a vent line which discharges directly into an exhaust. The actuators can be mass flow controllers, with which a mass flow can be set. The actuators can also be temperature regulators for heating or cooling for retaining liquid or solid sources at a source temperature. The liquid or solid sources are sources of metalorganic starting materials such as, for example, trimethyl gallium or trimethyl indium or trimethyl aluminum, which are tempered to a stable source temperature. The solid or liquid metalorganic starting materials are stored in source containers, for example bubblers, through which a carrier gas flows. The mass flow of the carrier gas is adjusted by an actuator, for example a valve or a mass flow regulator. In addition, pressure sensors or pressure actuators are provided with which the pressure in the metalorganic source can be measured or set. Furthermore, the device in accordance with the invention has gaseous sources, for example hydride sources. By means of actuators and/or sensors, the mass flow of the hydride, which may be $NH_3$, As $H_3$, $PH_3$ or $SiH_4$, can be set in the valve line or run line. Furthermore, other actuators are provided in the gas mixing system in order to dilute the flows and/or divert them. These actuators may be mass flow controllers (MFC), pressure controllers and multi-way valves. Furthermore, the gas mixing system has a plurality of sensors with which on the one hand, measured values which are relevant to the process can be determined. However, sensors are also provided which deliver measured values which are not relevant to the respective process step. In particular, such sensors are provided with which a temperature, a pressure or a mass flow is measured. By means of a total pressure sensor, the total pressure inside the process chamber can be determined. A process is carried out in accordance with a prescribed formula which is stored in a formula file and as a rule consists of a plurality of formula steps which are carried out in temporal sequence, wherein these steps may be at least flushing steps, heating steps, tempering steps, cooling steps and/or growth steps. In a flushing step, the process chamber is flushed with an inert gas. No starting materials, i.e. in particular no III precursors (in particular gaseous chemical compounds with an element from main group V), IV precursors (in particular gaseous chemical compounds with an element from main group IV)

or V precursors (in particular gaseous chemical compounds with an element from main group VI) are fed into the process chamber. In a heating step, the process chamber may be heated to a nominal temperature. In the heating step, a IV precursor or a V precursor may be fed into the process chamber. Tempering steps are provided in which the substrate is tempered to a tempering temperature and in particular is held at this temperature for a certain time. During the tempering step, only an inert gas, but also in addition one of the precursors may be fed into the process chamber. In a growth step, the starting materials (precursors) are fed into the process chamber in a manner such that a layer is deposited on the surface of the substrate or on the surface of previously deposited layers. The precursors can be fed into the process chamber at different growth temperatures and different process chamber pressures. The formula is usually written in a suitable programming language which can be read by people because it is a high level language. The formula may have been compiled in machine language. The formula or the data compiled from it may form a raw data pool. A device in accordance with the invention may have a communication processor via which a formula can be input via an interface, for example keyboard, screen or data transfer device. The formula is stored in a data memory which may be associated with the communication processor. The data from the formula are transferred via the communication processor forming the communication interface to a control processor which controls the actuators of the coating unit, i.e. presets the nominal values. The control processor is thus able to receive actual values from the actuators or sensors. It controls the process in real time. It can transmit the actual values from the actuators or from the sensors to the communication processor. The device in accordance with the invention has a log file which, for example, is associated with the communication processor, with which the data from at least some, preferably all of the sensors are stored as measured values during a process at prescribed time intervals, for example at intervals of one second, together with a time stamp. Furthermore, at least some, preferably all of the actuation values for the actuators are also stored in the log file as actuation data. The measured values and the actuation data can thus form a raw data pool in this manner. With the method in accordance with the invention or the device in accordance with the invention, from these raw data originating from the formula file and/or the log file, a condensed table, for example with mean values of only the relevant parameters and steps, can be formed. In this manner, compressed data are produced which facilitates the user in interpreting the process, in particular for depositing one or more semiconductor layers and its succession of steps. The determination of the time transients required in this regard can be determined either from the formula, in particular from the compiled formula, or from the log file. The raw data does not have to contain just the actuation data for the actuators. Moreover, they may also contain the measured values from sensors. The latter are taken from the log file. The compressed data may, for example, be obtained from the communication processor by analysis of the formula, from the control processor by evaluation of the formula and/or from the actual values or by evaluation of the log file. In order to deposit layer systems for the fabrication of light emitting diodes or HEMTs, a plurality of growth steps are carried out in succession in which respective thin III-V layers are deposited on top of one another. Each process which belongs to the fabrication of an individual semiconductor component consists of a defined number of steps, wherein in one step, not necessarily all but at least some characteristic actuation data, in particular a growth period or tempering period, are held at a fixed value for a specific period. An example of a characteristic actuation value may be a nominal temperature, for example, which has to be reached by a heating device for heating the process chamber roof or for heating the susceptor. The characteristic actuation values can vary during a step, however; for example, when several redundant sources are provided, then a switch from one source to a redundant second source may be carried out during a step. Furthermore, the device in accordance with the invention may also have solid or liquid sources. A source of this type has a source container, for example, in which a solid or liquid starting material is stored. A carrier gas is fed through this container. This is carried out by means of an immersion tube which is immersed in the solid or liquid starting material. Usually, the solid starting material is a powder. The carrier gas then flows through the solid or liquid starting material in analogous manner to a bubbler (wash bottle). With the aid of a thermodynamic relationship, knowing the temperature in the source container, the vapor pressure of the liquid or solid starting material can be determined. The conveying capacity of the source can be determined with the aid of this vapor pressure wherein, in addition to the source temperature, the gas pressure of the source as well as the mass flow of the carrier gas flowing through the source is taken into consideration. The conveying capacity of the source, i.e. the mass flow of the starting material out of the source, can be calculated using the relevant physical laws. The actuation data are contained in the formula.

With the method in accordance with the invention, during the running process or following a process carried out to the end, initially, the sequence of steps and their type is determined. This is not carried out using formula commands under the heading of data capture, but exclusively by using the raw data, in particular exclusively the actuation data. As an alternative to this, however, the steps may also be obtained by means of a type of simulation or compilation from the formula. This is preferably always carried out in an automated manner, so that it is not necessary for specific process steps for data capture to be defined by a process engineer. However, the log data are provided to be used and in particular, measured values are provided to be used for the determination of the process steps. In this regard, initially, process parameters are obtained from the raw data and in particular from the actuation data. The process parameters are parameters which are calculated from the raw data, in particular from the actuation data. In this regard, the raw data are correlated by means of a computer. In a device in accordance with the invention, several redundant sources for the starting materials may be provided. The starting material can then selectively be fed into the process chamber from one of the several similar types of starting material sources. The mass flow of the starting material from its source into the process chamber is determined by the position of mass flow controllers and a plurality of valves. In order to characterize a process step, it is not necessary to know in detail which valves are open and/or which flows are running. Rather, it is the result of the setting of the relevant valves or mass flow controllers which is of relevance, namely the mass flow of one or more of the starting materials flowing into the process chamber. A further value which is relevant to the characterization of a process step may be a temperature inside the process chamber and/or a pressure inside the process chamber. These values are characteristic of the process step. The actuation data are prepared by means of a mathematical relationship which determines, for example, the mass flow of a hydride or a metalorganic compound into the process chamber from the position data. Examples of process parameters in this regard are mass flow values for the precursors which are simultaneously supplied to the process chamber. Furthermore, the process parameters are also temperature actuation values for the susceptor, the process chamber roof and the substrate surface. These process parameters are analyzed in a further step for the determination of the process steps. In a similar calculation, as is the case when generating a formula, mass flows for the metalorganic precursor are determined from the temperatures of the liquid or solid sources, from the mass flows of the carrier gases flowing through the source and from the gas pressure in the source using the thermodynamic relationships as well as the position of the valves associated with the source. In this regard, the physical source of the mass flows is irrelevant. What is essential here is the mass flow into the process chamber given by the actuation data. Further process parameters may be the nominal temperature values and the nominal pressure values in the process chamber. By means of these process parameters obtained from the raw data, the beginning and end of the process steps are therefore determined. To this end, the temporal profile of the process parameters is observed. A process step may, for example, be defined such that the process parameter does not vary over a specific period. When the profile of the process parameters does not vary over a period which is above a limiting period, for example 5 seconds, then the computer identifies this as an individual process step. The duration of the process step and its type, which is set, for example, by the respective precursor flowing into the process chamber or the pressure or temperature, are stored, whereupon the type is defined by an individual combination of process parameters. Process steps of the same type therefore contain process parameters which match or are at least similar. If the type is defined by a plurality of different process parameters, then the type of two process steps can be considered to match when the process parameters lie in a limited hyperspace of a multi-dimensional coordinate system which is spanned by the individual process parameters. During the process, in addition to the actuation data, the measured values are also processed. The measured values are preferably processed in each process step. However, processing may also be carried out only in individual process steps. When processing the measured values, characteristic process step variables are determined. The process step variables may, for example, be the actual temperature in the process chamber, the actual pressure in the process chamber, the actual surface temperature of the susceptor, the actual surface temperature of the substrate, an optical property of the substrate, or the growth rate of a layer, as well as any other response of the depositing unit to the process parameters which is measured by the sensors, for example a control valve position, a heating or cooling capacity, etc. Any physical variable which describes a state of a unit, in particular a peripheral unit of the device, may in principle be considered to be a process step variable. In similar manner to the processing of the actuation values where, for example, the process parameters are determined from a sub-group of the actuation values, when processing the measured values, a sub-group of the measured value may be used as the process variable. When processing the measured values, start-up effects at the beginning of a process step can be suppressed. This is carried out by only starting to use the measured values to obtain the process step variables when a start-up transient period has passed, i.e. the measured values have stabilized. The measured values are then determined for a prescribed time which in particular is individually tailored to the process step. From a plurality of the measured values obtained in temporal sequence, a mean and a median deviation from the mean can be formed. These and/or further process step variables are stored. When a process with an individually tailored sequence of process steps is carried out for the first time, then following the process, the quality of the deposited layer or sequence of layers is analyzed. If the quality of the layer or sequence of layers satisfies a specification, then the process parameters and the process steps analyzed therefrom as well as the process step-specific process variables are stored in a process data memory. The process parameters are calculated with the aid of a mathematical/physical model, wherein the model digitally reflects the construction of a gas mixing system or a reactor. The model contains the physical relationships for the actuation data for coupling together device-specific characteristic actuation values. The process data memory thus contains a pool of process data which belongs to processes with which a layer or a sequence of layers has been deposited which satisfy the quality specifications. Comparative variables are formed from the process step variables for a plurality of processes of the same type. Thus, the comparative variables are historical process step variables which in particular contain a mean and a variance. If after this initial collection of data in order to establish the historical process step variables, i.e. the comparative variables for a process which has already been stored in the process data memory, and if this process is detected in the manner described above by identifying its process steps, then the process variables for the individual process steps obtained in the actual process can be compared with the historical comparative variables from the process data memory. If the process data lie in a range of values around the mean defined by the range of variation, then the process step is considered to be qualitatively in order. In particular, it is provided that a process will then only be considered to be in order when the process step variables of all process steps of the process match the historical comparative variables in a manner such that the process step variables lie inside the range specified by the range of variation. It is particularly advantageous if, during the determination of the process parameter, only actuation data are used wherein the process parameters in particular are obtained only from actuation data for those actuators which can influence the characteristic measured values during a process step by varying their settings. It is in particular provided that the process data are obtained only from the actuation data for those actuators the settings of which influence a temperature in the process chamber, a mass flow of a source containing a liquid or a solid metalorganic starting material transported by means of a carrier gas into the process chamber, a hydride, in particular transported into the process chamber with a carrier gas and/or a total pressure in the process chamber. In particular, the actuation data are valve positions of 2/2-way valves, 5/2-way valves, 4/2-way valves as well as actuation values for pressure or heat controllers. The measured values used to form the process variables may, however, also concern parameters from peripheral cooling water units of the device. The measured values for forming the process variables may then be characteristic measured values for a cooling circuit. With the method in accordance with the invention, it is possible, without knowing a formula and its steps, to identify processes from their technologically identical or technologically similar processes, so that process parameters are obtained from the raw data, in particular the actuation data, by compiling the raw data. This is preferably carried out by means of a mathematical model, for example a digital image of the device, in particular of the gas mixing system and the reactor. In particular, the mathematical model contains the physical relationships between the actuators. The process steps determined during the data processing do not have to be identical with the steps stored in the formula. During the preparation of the raw data for determining the process parameters, a first condensation of data is carried out. From the several hundred megabyte-long, in some cases even gigabyte-long log file, a quantity of data a few kilobytes long is extracted which is represented by the process parameters. With the aid of a data analysis which contains an observation of the temporal profile of the process parameters, the start and end of the process steps is identified. Because, in addition, the actuation data also identify which precursor or which combination of precursors flow into the process chamber, by means of the analysis of the temporal profile of the process parameters, it is not just the start and the end of each process step which can be determined. The type (growth step for a first III-V layer, growth step for a second III-V layer, tempering layer, etc.) of the process step can also be determined, or in fact a process step can be unequivocally identified with the aid of the individual process parameter combination. The process parameter combination may contain a pressure value. In this regard, it may be the total pressure inside a process chamber. However, it may also be a pressure in a peripheral unit. A process parameter of the process parameter combination may also be at least one parameter determining a temperature. As an example, the temperature of a substrate is not only determined by the temperature of the susceptor carrying the substrate. Rather, the temperature of the substrate is also influenced by the temperature of the reactor roof, a flushing flow, which can cause a substrate carrier to rotate, and the type of flushing flow. Hydrogen has heat transfer properties that differ from nitrogen. In order to determine the process step, in particular, those process parameters are selected which give the process step a distinctive fingerprint. This determination may be carried out immediately after the end of the process. However, the data analysis may also be carried out during the process. A second compression of the data is carried out by processing the measured values. The measured values are subjected to a variation with time because they are actual values recorded by the sensors. As an example, they are temperature measured values. The temperature measured values may not only be the temperature measured values cited above from regions inside the process chamber. They may also be temperatures of baths in which the source containers for the metalorganic sources are tempered. Furthermore, they may also be cooling water temperatures. Process step-specific or, more generally, process step variables are determined from these measured values. During the process step variable determination, for each sensor value, only one datum per measuring step is preferably stored. However, two pieces of data could also be stored, for example a mean and a variance. However, storing just a mean may also be sufficient. Preferably, formation of the mean is not carried out over the entire duration of the process step, but—as discussed above—only over a temporally limited range, namely after the end of a start-up transient to the end of a process step, for example. The process step variables characterize actual values of parameters which are relevant to the process. By means of a comparison of the process step variables, for example the actual temperatures or the actual pressures or the actual growth rates of the deposited layers, with historical data, after the end of a process, a prediction may be output which contains an expectation for the layer quality. If the process step variables lie in the range of the historical comparative variables, then this is an indication that the deposited layer or sequence of layers is free from defects, so that it can be processed further in a downstream fabrication process in which semiconductor components are manufactured from the coated wafer. However, if the process step variables deviate substantially in at least one process step from the comparative variables for the same process step of a historical process, then this may be an indication that the quality of the deposited layer or sequence of layers is not sufficient for specific applications. The coated wafer fabricated in the process in this manner can then be classified as a reject or as of inferior quality. It is therefore possible, immediately following the process, to decide which of the wafers fabricated in the process will be processed further or which are to be considered as rejects. Obtaining the process parameters and the subsequent analysis in order to identify the process steps can be carried out during use of formula data or data compiled therefrom even before the process is carried out. If additional measured values from sensors are used, then the parameters or the analysis of the temporal profile of the process parameters may be obtained during the process or after the process. The formation of the characteristic process step variables may even be carried out during the process or following the process. Similarly, the comparison of the process step variables with comparative variables stored in a process data memory may even be carried out during the process or after the process. If an evaluation of the quality of the deposited layer is to be carried out not in the MOCVD unit itself but by an external production management system, then the process step variables indicated after process steps which are additionally uniquely identifiable through the determined process parameters, which already take the physical relationships in the unit into account, constitute an ideal starting point for external "Big Data" data analyses. The compressed data set can thus form a basis for external determination of correlations when an external evaluation of the quality of the deposited layers is available. Furthermore, with the analysis of the process, in particular the identification of the process steps, an automatic, more complex analysis of any in situ measurement systems is triggered. Thus, for example, on the basis of identified process steps, it is possible to switch measuring instruments on or off. If, for example, the process analysis shows that a specific process step is a growth step in which a layer is deposited, then a layer thickness measuring instrument could be switched on automatically and at the end of the process step, it could be switched off again. If a reflectance measuring instrument, for example an interferometer, is used as the layer thickness measuring instrument, then the periods of the interference measured values could be counted, for example. Furthermore, the measuring instrument could have transmitted to it information regarding the chemical and/or physical properties of the layer to be deposited in the respective process step, so that the measuring instrument to some extent automatically selects a measurement range.

BRIEF DESCRIPTION OF THE DRAWINGS

An exemplary embodiment of the invention will now be described with the aid of the accompanying drawings, in which:

FIG. 2 shows a gas selection switch 1, FIG. 3 shows a hydride source 5, FIG. 4 shows a run/vent switch 8, FIG. 5 shows a metalorganic source 10, FIG. 6 diagrammatically shows a reactor 14, and FIG. 7 diagrammatically shows, as a block diagram, elements of the method in accordance with the invention.

DETAILED DESCRIPTION

Figure 1:
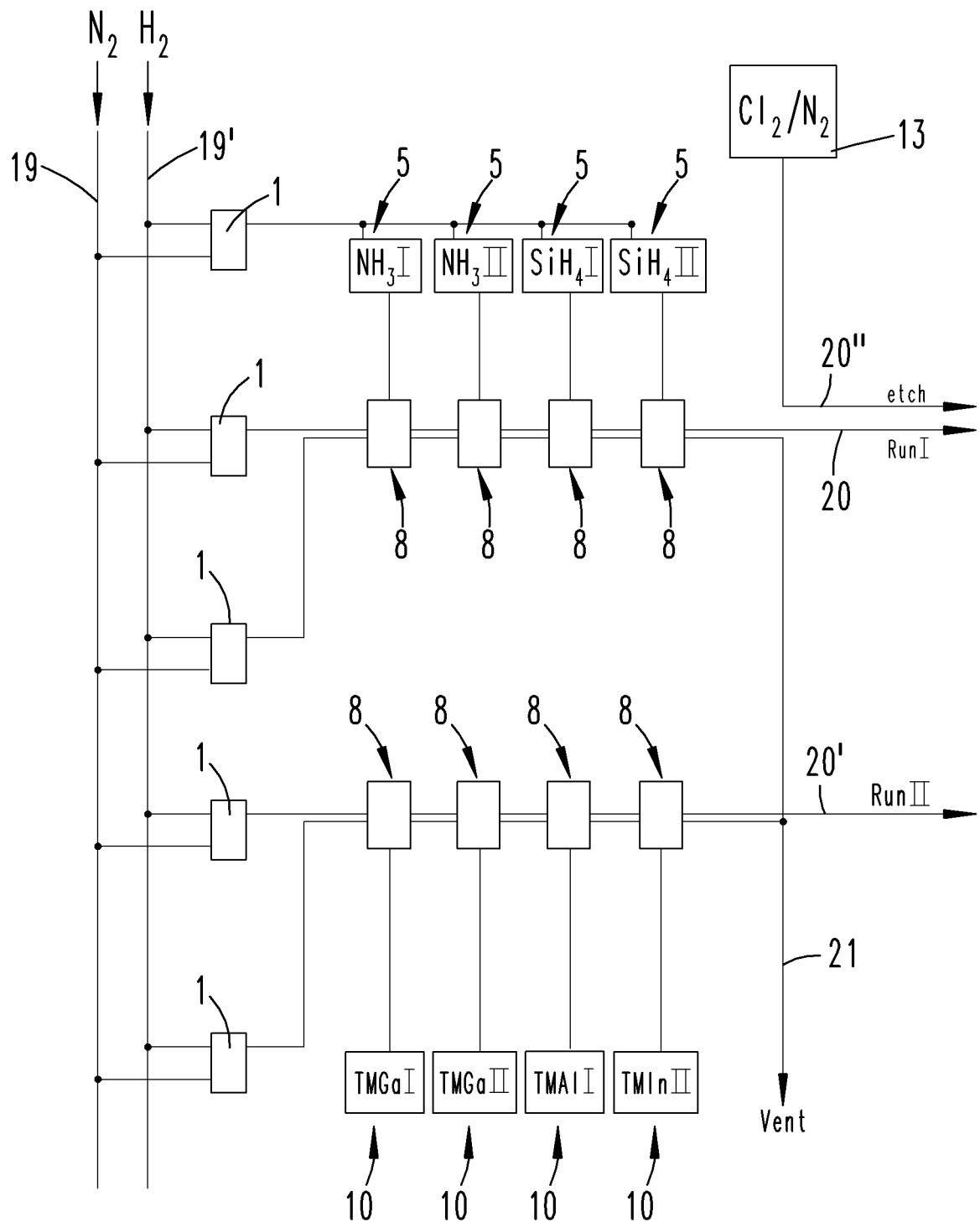
FIG. 1 diagrammatically shows an exemplary embodiment of a gas mixing system of a device in accordance with the invention.

FIG. 6 shows a CVD reactor. The reactor has a gas-tight reactor housing 14 which can be evacuated using a vacuum pump, not shown. In the reactor housing 14 is a heater 22 which may be an infrared or a RF heater, with which a susceptor 17 disposed above the heater and which is produced from graphite, for example, can be heated to a process temperature. The heater 22 is controlled by means of the heating control 23. The temperature of the susceptor 17 is determined with a temperature sensor 24, for example a thermocouple. The thermocouple 24 may also be used for regulation. A pressure sensor 3 is provided with which the total pressure in the reactor housing or the process chamber can be determined. The pressure is adjusted with a "butterfly valve" which is disposed in a suction line, not shown, via which the reactor housing is connected to a vacuum pump. A pressure controller produces an actuation variable for this valve. The nominal value is determined with the pressure sensor 3. One or more substrates 18 lie on an upper wide side face of the susceptor 17 which are coated with one or more layers in a coating process. They may be silicon substrates, III-V substrates, sapphire substrates or other types of substrate. A III-V layer sequence may be deposited on the substrates, for example for light emitting diodes.

A process chamber 15 is positioned between the susceptor 17 and a process chamber roof 15'. The process chamber roof 15' may be configured as a gas inlet means, for example when the gas inlet means is a showerhead. However, in the exemplary embodiment, the gas inlet means 16 has a central position above the susceptor 17 and two separate supply lines 16', 16" which discharge separately into the process chamber 15. Various process gases can be fed into the process chamber through the supply lines 16', 16".

The reference numeral 25 indicates a temperature sensor. This temperature sensor 25 may be an optical temperature sensor, for example an IR pyrometer or a UV pyrometer. The surface temperature of the substrates 18 can be measured with this temperature sensor 25. Furthermore, with the optical sensor 25, the layer thickness or the growth rate of a layer on the substrate 18 or its layer composition can be determined.

The starting materials fed into the supply lines 16', 16" of the gas inlet means 16 are mixed together in a gas mixing system, as can be seen in FIGS. 1 to 4. FIG. 1 shows the gas selection switch 1, run/vent switch 8, hydride source 5 and MO source 10 elements just as blocks. They are shown in more detail in FIGS. 2 to 4.

The gas mixing system contains two gas inlet lines 19, 19' through which $N_2$ or $H_2$ is supplied. By means of a plurality of gas selection switches 1, nitrogen or hydrogen may be selected. In this regard, the gas selection switch 1 has two actuators which are each constructed from a 2-way valve 2. The gas selection switch 1 also contains a mass flow controller/sensor 4 which can also carry out the function of an actuator. In addition, pressure sensors may be provided which each provide a pressure measured value in this section of the line system. The mass flow controller 4 may also deliver a mass flow measured value. Several in particular redundant hydride sources 5 are provided. In particular, $NH_3$, $AsH_3$, $PH_3$ or $SiH_4$ is used as the hydride. The hydride source 5 which is shown in FIG. 3 has a 3/2-way valve, several mass flow controllers 4 and a gas tank 7 which contains the respective hydride. The gas tank 7 is only symbolically shown. As a rule, it is configured as a central gas supply.

FIG. 5 shows the source for a metalorganic starting material. In the exemplary embodiment, two source containers (bubblers 12) are provided, which each contain the same metalorganic starting material. Instead of the two source containers 12, however, just one could be provided. The source 10 has several mass flow controllers 4 and one 4/2-way valve 11 as actuators. A concentration measuring instrument 47 may be provided as the sensor so that the concentration of the metalorganic compound in the gas flow can be determined. The concentration can be specified using the two mass flow controllers 4. An additional pressure controller 4' may also be provided. A temperature controller 26 is used to regulate the temperature of the source container 12 to a nominal temperature. FIG. 1 shows two sources for TMGa and two sources for TMA1.

The starting material provided from the hydride source 5 or from the MO source 10 can be supplied by means of the run/vent switch 8 shown in FIG. 4, or to the vent line 21 which leads directly to the exhaust and which is provided to stabilize the flows. The run line, or respectively the run lines RUN I and RUN II, are connected to the supply lines 16', 16". The run/vent switch 8 has a five/two-way valve.

Other units may be provided, for example an etch gas source with reference numeral 13.

Actuation values which provide valve positions, for example, or actuation value details for temperatures or pressures, are provided in a formula. By means of this formula, a process is carried out in which one or more layers are deposited on one or more substrates disposed in the process chamber 15. A process contains a plurality of steps. The steps are carried out in a temporal succession and have individual properties. Essential actuators, i.e. valves or mass flow controllers, may have an identical nominal value for a certain period. The essential actuators are those actuators which influence the quality of the process steps when in the operating position.

All of the valve positions, temperature specifications, pressure specifications, mass flow specifications etc. are stored as actuation values SD in a log file 40, as raw data RD. Furthermore, all of the measured values MW from the sensors, i.e. In particular temperature sensors, pressure sensors or mass flow sensors, are stored in the log file 40. For a process with a duration of several hours and with a data acquisition frequency of one second, a very large quantity of data is produced. From this quantity of data, in a first step, without knowing the formula, the process steps P1 to Pn are identified. To this end, initially, process parameters PP are obtained from the raw data RD and in particular from the actuation data SD for the actuators 2, 4, 6, 9, 11, 23. The process parameters PP are data obtained from the raw data RD by means of a computer which makes process step-specific specifications. To this end, the raw data RD, in particular only the actuation data SD, are correlated mathematically, wherein with the mathematical relationship, a process parameter computation 41 is carried out. The right hand side of FIG. 7 indicates that a process parameter PP1, for example, can be obtained from a mathematical relationship between the actuation data SD1 and SD2. A second process parameter PP2 may be obtained from a relationship of the actuation data SD2 and SD4. The mathematical relationships for determining the process parameters PP from the actuation data SD may be specified by a program in the computer. These are therefore prescribed mathematical relationships between the actuation data SD, by means of which the process parameters PP are determined. In this regard, the mathematical relationships reflect the physical relationships of the actuation data SD; as an example, the process parameter PP2 may be the mass flow rate of a metalorganic starting material, whereas the actuation value SD6 is a temperature of the source container 12. Thus, with the mathematical relationship, the mass flow from the source 10 can be calculated from the temperature nominal value and a mass flow of a carrier gas (actuation value SD5) through the source container 12.

By means of the correlation of the actuation data SD during the process parameter computation 41 (FIG. 7), for example, by considering a redundant arrangement of several hydride sources 5 or a plurality of MO sources 10, from only the valve positions and the pressures, temperatures in the source container 12, the mass flow of a metalorganic compound or respectively a hydride through the run line 20, 20' or through the vent line 21 can be determined. In this calculation, the physical relationships between a source temperature and a mass flow of a carrier gas through a source container 12 of a MO source 10 are also taken into account in order to determine the mass flow of the MO precursor which constitutes a process parameter.

During the determination 41 of the process parameter PP, stored in particular in a process data memory 44, a first data compression of the raw data RD is carried out.

In a subsequent step, in a process step determination, each of the plurality of successive process steps P1 to Pn is identified. The process steps P1 to Pn identified during the process step determination 42 do not have to match the steps of the formula. Here, the boundaries of the process steps could be completely different. They essentially depend on the selection of the mathematical relationships of the actuation data SD. In this manner, as can be seen on the right hand side of FIG. 7 with respect to the process step determination 42, the temporal profiles of the process parameters PP1 to PP3 are observed. A region in which the process parameters PP1 to PP3 do not vary over a specified period, for example at least 5 seconds, is identified as a process step Pi. In this manner, the whole process can be split up into a plurality of process steps, wherein these may differ from the steps specified in the formula. The process steps P1 to Pn can, however, be reproducibly identified in a process with the same formula.

Subsequently, a measured value evaluation 43 is carried out with the aid of the measured values MW, wherein the measured values MW, and in particular the measured values relevant to the respective process step, are analyzed with respect to a mean and a variance from the mean. To this end, start-up transients are considered. As an example, acquisition of the measured values MW in order to form a process step variable PG is only carried out after a defined period following the start of the respective process step Pi. After this point in time to the end of the process step, for example, from a measured value, with the aid of suitable mathematical relationships which take the properties of the unit into account, means are formed from a plurality of measured values MW which are used as the process step variable PG further on in the method and which can also be stored in the process data memory 44. In addition, by forming a pure mean for the identified growth steps, more complex analyses of external in situ measuring systems as well can be envisaged as being carried out or triggered; their results act as process step variables such as, for example, the growth rates derived from the analysis of the periodicity of reflectance signals. In order to measure the layer thickness, one or more interferometers may be employed which provide periodically varying measured values. From the periodicity, the layer thickness or the growth rate can be determined. The invention proposes that these measuring instruments are triggered with the aid of the information obtained in accordance with the method of the invention, i.e. they are switched on or off. If, for example, process parameters PP are determined which can be assigned to a process step in which a layer is deposited, then at the start of the process step, a measuring instrument is switched on and at the end of the process step, it is switched off again. Layer thickness measuring instruments, for example interferometers, require details regarding the optical properties of the layer to be deposited in the process step in order to quantify the growth rate or the layer thickness. These properties can be determined from the process parameters PP.

If a process is carried out for the first time, then the process steps P1 to Pn and the process step variables PG obtained in it are stored in the process data memory 44 as comparative variables VG. However, this is only carried out when the quality analysis on the deposited layer or the deposited layers produces the result that the layers satisfy a quality requirement. If the layers do not satisfy the specified quality requirements, then the computed values are discarded. In this manner, initially, a historical data pool is produced with several identical processes which has one or more comparative variables VG for each process step P1 to Pn, wherein each comparative variable VG corresponds to a process step variable PG, for example a temperature or a total pressure, where it is expected that the process step has been carried out successfully.

With the aid of this historical data pool, in accordance with the invention, predictions can be made as to whether a sequence of layers which is processed later with this process will or will not satisfy the quality requirements. To this end, in a data comparison 45, the process variables PG of the process steps P1 to Pn of the actual process are compared with the comparative variables VG in the process data memory 44. If all of the process variables PG lie in a "good" range which is defined by a mean and a range of variance of the comparative variables VG, then the layer deposited on the substrate or sequence of layers is considered to be in order. The data comparison 45 results in the output of a response signal A which makes a prediction as to whether the layer or sequence of layers is promising and can be observed further. In the case of a sequence of layers which is assessed as not being in order, a first indication as to which sub-layer and which measured values are involved greatly facilitates troubleshooting.

The reference numeral 46 indicates data updating. The process variables PG of processes which deliver qualitatively satisfactory layers can be stored in addition to the historical data already stored in the process data memory 44 in order to update the data that are stored therein. This means that long-term drift effects can be intercepted.

The above discussions serve to illustrate the inventions encapsulated in the application which progresses the prior art at least by means of the following combinations of features both independently and wherein two, a plurality of or all of these combinations of features may also be combined, namely:

A method which is characterized in that process parameters PP are obtained from the raw data RD by means of a computer by correlating 41 the raw data RD, in that the start and the end of process steps P1 to Pn are identified by means of an analysis 42 of the temporal profile of the process parameters PP.

A method which is characterized in that the type of the step which is detected is determined or the step is identified from the process parameters PP.

A method which is characterized in that corresponding characteristic process step variables PG are formed from the measured values MW from sensors 3, 4, 4', 24, 25, 47 for at least some of the process steps P1 to Pn of their respective type.

A method which is characterized in that an automatic, more complex analysis of any in situ measuring systems, in particular reflectance measurements, is triggered for the identified process step and a corresponding process step variable, for example a growth rate, is formed with the result of the analysis.

A method which is characterized in that the process step variables PG obtained in this manner are compared with comparative variables VG stored in a process data memory 44 allocated to an at least similar process step.

A method which is characterized in that the raw data RD are taken from a log file 40 in which the temporal sequence of the actuation data SD and measured values MW from sensors 3, 4, 4', 24, 25, 47 are stored and/or in that the raw data RD are taken from the unit process sequence control system and/or in that the raw data RD are taken from formula data.

A method which is characterized in that the comparative variables VG are formed from measured values MW which have been determined in one or more processes which have been carried out previously.

A method which is characterized in that the process step variables PG are only compared with the comparative variables VG when all of the process steps P1 to Pn of the process match at least as regards the sequence and/or type and/or duration with the process steps P1 to Pn of the processes which have been carried out previously, within prescribed limits.

A method which is characterized in that the comparative variables VG respectively contain a mean value which has been time-averaged over the measured values MW of a plurality of previous processes and contain a value for a range of variance, wherein the process variables PG are considered to match the comparative variables VG within prescribed limits when the process step variables PG lie in the range of variance around the mean value of the comparative variables VG and are considered not to match the comparative variables VG within prescribed limits when the process step variables PG lie outside the range of variance.

A method which is characterized in that during the determination of the process step variables PG or the comparative variables VG, start-up effects are suppressed and/or mean values are formed from the measured values and/or a mean deviation is formed from the mean value.

A method which is characterized in that exclusively actuation data SD are used to obtain the process parameters PP, wherein the process parameters PP in particular are obtained only from the actuation data SD from those actuators 2, 4, 6, 9, 11, 23 which influence the measured values MW during a process step Pi by varying the setting thereof.

A method which is characterized in that the process parameters PP are obtained from the actuation data SD of only those actuators 2, 4, 6, 9, 11, 23 the settings of which influence a temperature in the process chamber 15, a mass flow of a metalorganic starting material transported into the process chamber 15 from a source 12 containing a liquid or a solid with a carrier gas, a hydride, in particular transported into the process chamber 15 with a carrier gas and/or a total pressure in the process chamber 15.

A method which is characterized in that the actuation data SD are actuation values for the positions of valves 6, 9 and/or nominal value specifications for mass flow controller 4, pressure controller 4', in particular for a source pressure and/or for controlling the process chamber pressure and/or temperature controllers 23.

A method which is characterized in that the measured values MW are temperature measured values from temperature sensors 24, 25, pressure measured values from pressure sensors or optical sensors, wherein in particular, a measured value MW is a surface temperature of the substrate 18, a surface temperature of the susceptor 17, an optical property of the substrate 18 and/or a layer thickness of a layer deposited on the substrate 18.

A method which is characterized in that the process parameters PP are computed mass flows of gaseous starting materials into the process chamber 15 through valves 6, 9, mass flow controllers 4, pressure controllers 4' and optionally temperature controllers 26 selected by the actuation values SD.

A method which is characterized in that the process parameters PP are calculated from the temperature actuation values from temperature controllers 26 for solid or liquid sources 10, from the mass flows of carrier gases flowing through source containers 12 and from the gas pressure in the source container 12 using their thermodynamic relationships, as well as from the positions of the valves associated with the source 10.

A device which is characterized in that the computer is programmed and configured in a manner such that process parameters PP are obtained from the raw data RD which identify the start and end of process steps P1 to Pn and/or their type from an analysis 42 of the temporal profile of the process parameters PP.

A device which is characterized in that from the measured values MW for at least certain of the process steps P1 to Pn of their respective type, corresponding process step variables PG are formed and in that the process step variables PG obtained in this manner are compared 45 with comparative variables VG associated with an at least similar process step stored in a process data memory 44.

A device which is characterized in that the computer is programmed in accordance with one of the characterizing features of claims 2 to 16.

All of the disclosed features are essential to the invention (in themselves, but also in combination with each other). In this regard, the disclosure of the application incorporates the entire contents of the disclosures in the associated/accompanying priority documents (copy of priority document); this includes features of these documents in the claims of the present application. The features of the dependent claims characterize, even without the features of a claim upon which it is dependent, individual inventive embodiments of the prior art, in particular for the purposes of filing divisional applications on the basis of these claims. The invention defined in each claim may additionally have one or more of the features defined in the present description, in particular those provided with reference numerals and/or appearing in the list of reference numerals. The invention also concerns implementations in which individual features of the present description are not embodied, in particular if they are clearly unnecessary for the respective purpose or can be replaced by other means with the same technical effect.

| LIST OF REFERENCE NUMERALS | |
|---|---|
| 1 | Gas selection switch |
| 2 | Two-way valve, actuator |
| 3 | Pressure sensor |
| 4 | Mass flow controllerer sensor, actuator |
| 4' | Pressure controller |
| 5 | Hydride source |
| 6 | Valve, actuator |
| 7 | Gas tank |
| 8 | Run/vent switch |
| 9 | Valve, actuator |
| 10 | MO source |
| 11 | Actuator |
| 12 | Bubbler |
| 13 | Etch gas source |
| 14 | Reactor |
| 15 | Process chamber |
| 15' | Process chamber roof |
| 16 | Gas inlet means |
| 16' | Supply line |
| 16" | Supply line |
| 17 | Susceptor |
| 18 | Substrate |
| 19 | Gas inlet line |
| 19' | Gas inlet line |
| 20 | Gas outlet line |
| 21 | Gas outlet line |
| 22 | Heater |
| 23 | Heating controller, actuator |
| 24 | Sensor |
| 25 | Temperature sensor |
| 26 | Temperature controller |
| 40 | Log file |
| 41 | Process parameter computation |
| 42 | Analysis |
| 43 | Measured value evaluation |
| 44 | Process data memory |
| 45 | Data comparison |
| 46 | Data updating |
| 47 | Gas concentration measuring instrument |
| MW | Measured value |
| PG | Process step variable |
| PP | Process parameter |
| PP1 | Process parameter |
| PP2 | Process parameter |
| PP3 | Process parameter |
| PP4 | Process parameter |
| P1 | Process step |
| P2 | Process step |
| P3 | Process step |
| P4 | Process step |
| P5 | Process step |
| P6 | Process step |
| P7 | Process step |
| Pi | Process step |
| Pn | Process step |
| RD | Raw data |
| SD | Actuation data |
| VG | Comparative variables |

What is claimed is:

1. A method, comprising:

for a first plurality of process steps that have been carried out prior to a deposition process, determining comparative variables (VG) that correspond to process step variables (PG), the comparative variables (VG) formed from measured values (MW) determined from the first plurality of process steps, wherein the first plurality of process steps includes at least:

(i) a flushing step in which a process chamber (15) is flushed with an inert gas, (ii) a heating step in which the process chamber (15) is heated, (iii) a tempering step, and (iv) a growth step in which starting materials are fed into the process chamber (15), depositing at least one layer on a substrate (18) in the process chamber (15) of in accordance with the deposition process;

receiving, by a computing device, raw data (RD) associated with the deposition process, the raw data (RD) containing a temporal sequence of actuation data (SD) used to control a plurality of actuators (2, 4, 6, 9, 11, 23) during the deposition process, wherein the actuation data (SD) includes:

(i) actuation values for positions of valves (6, 9) and (ii) value specifications for one or more of:

(a) a mass flow controller (4), (b) a pressure controller (4') for controlling a pressure of the process chamber (15), or (c) temperature controllers (23);

determining, by the computing device, process parameters (PP) from the raw data (RD), the determination comprising correlating (41) the raw data (RD), wherein the process parameters (PP) include a mass flow rate of a precursor, a temperature of the process chamber (15) and the pressure of the process chamber (15); and identifying, by the computing device, a second plurality of process steps (P1 to Pn) that were used to deposit the at least one layer on the substrate (18), including a start and an end of each of the identified process steps (P1 to Pn), by analyzing respective temporal profiles of the process parameters (PP), wherein each of the identified process steps (P1 to Pn) correspond to respective regions of the temporal profiles;

for at least some of the identified process steps (P1 to Pn), determining, by the computing device, the process step variables (PG) based on values measured from a plurality of sensors (3, 24, 25, 47), wherein the process step variables (PG) include one or more of the temperature of the process chamber (15), the pressure of the process chamber (15), a surface temperature of a susceptor (17), a surface temperature of the substrate (18) disposed on the susceptor (17), an optical property of the substrate (18), or a growth rate of the at least one layer on the substrate (18);

comparing, by the computing device, the process step variables (PG) with the comparative variables (VG), wherein the process step variables (PG) are considered to match the comparative variables (VG) within prescribed limits when the process step variables (PG) respectively lie in a range around a corresponding comparative variable (VG) and are considered not to match the comparative variables within prescribed limits when one or more of the process step variables (PG) lie outside the range around the corresponding comparative variable (VG); and determining, by the computing device, a quality of the at least one layer based on the comparison of the process step variables (PG) with the comparative variables (VG), wherein the at least one layer is determined to have a satisfactory quality if the process step variables (PG) match the comparative variables (VG) within the prescribed limits.

2. The method of claim 1, further comprising identifying a type of at least one of the identified process steps (P1 to Pn) from the process parameters (PP).

3. The method of claim 1, wherein the raw data (W) are extracted from one or more of:
   (i) a log file (40) in which the temporal sequence of the actuation data (SD) is stored;
   (ii) a unit process sequence control system; or
   (iii) formula data.

4. The method of claim 1,
   wherein the comparative variables (VG) respectively contain a mean value which has been averaged over the measured values (MW) determined from the first plurality of process steps, and
   wherein the range of the corresponding comparative variable (FG) comprises a range of variance around the mean value of the corresponding comparative variable (VG).

5. The method of claim 1, wherein the process parameters (PP) are exclusively determined from the actuation data (SD) of the raw data (RD).

6. The method of claim 1, wherein the measured values (MW) are one or more of temperature measured values from temperature sensors (24, 25), pressure measured values from pressure sensors (3) or light measured from optical sensors.

7. The method of claim 1, wherein the process parameters (PP) are calculated from:
   (i) temperature actuation values from temperature controllers (26) for solid or liquid sources (10),
   (ii) mass flows of carrier gases flowing through source containers (12),
   (iii) gas pressure in the source containers (12), and
   (iv) the positions of the valves (6, 9).

8. The method of claim 1, further comprising switching one or more of the sensors on or off based on one or more of the process parameters (PP), the identified process steps (P1 to Pn) or a type of each of the process steps (P1 to Pn).

9. The method of claim 1, wherein the respective regions of the temporal profiles do not vary over a time period.

* * * * *